United States Patent [19]
Phillips et al.

[11] Patent Number: 5,615,160
[45] Date of Patent: Mar. 25, 1997

[54] MINIMAL RECHARGE OVERHEAD CIRCUIT FOR DOMINO SRAM STRUCTURES

[75] Inventors: Larry B. Phillips; Robert P. Masleid; John S. Muhich, all of Austin, Tex.

[73] Assignee: International Business Machines Corporation, Armonk, N.Y.

[21] Appl. No.: 525,994

[22] Filed: Sep. 8, 1995

[51] Int. Cl.⁶ ........................................... G11C 7/00
[52] U.S. Cl. ................ 365/203; 365/189.05; 365/194
[58] Field of Search .................................... 365/203, 204, 365/189.04, 189.05, 194, 205, 207

[56] References Cited

U.S. PATENT DOCUMENTS

| | | | |
|---|---|---|---|
| 4,851,714 | 7/1989 | Hwang | 307/448 |
| 4,896,057 | 1/1990 | Yang et al. | 307/448 |
| 5,068,825 | 11/1991 | Mahant-Shetti et al. | 365/154 |
| 5,121,003 | 6/1992 | Wiliams | 307/452 |
| 5,289,431 | 2/1994 | Konishi | 365/230.03 |
| 5,481,500 | 1/1996 | Reohr et al. | 365/203 |

FOREIGN PATENT DOCUMENTS 0417197  1/1992  Japan.

OTHER PUBLICATIONS

IBM Technical Disclosure Bulletin, vol. 37, No. 7, Jul. 1994; pp. 515–516.

*Primary Examiner*—Joseph A. Popek
*Attorney, Agent, or Firm*—Benman Collins & Sawyer; Michael A. Davis, Jr.

[57] ABSTRACT

A system and method for improving a domino SRAM that eliminates the need for additional transistors in series with evaluation transistors. The regular structure inherent in RAM arrays is used to minimize both the effective recharge cycle time and the recharge power required to recharge the various levels of domino SRAM circuits. Using a clock signal as a reference, recharge signals are timed to each other and to other functional signals. By adjusting buffers and wiring delays associated with each recharge signal, the recharge signals sent to each level of logic are delayed until the recharge of the previous level is complete.

6 Claims, 2 Drawing Sheets

MINIMAL RECHARGE OVERHEAD CIRCUIT FOR DOMINO SRAM STRUCTURES

CROSS-REFERENCE TO RELATED APPLICATIONS

The present application is related to applications Ser. No. 08/525,939, entitled "High Speed SRAM With OR-Gate Sense" filed on the same date as the present application and assigned to the assignee of the present application.

FIELD OF THE INVENTION

The present invention relates to random access memories in microprocessor applications, and more particularly to a system and method for minimizing both the effective recharge cycle time and the recharge power required to recharge domino SRAM circuits.

BACKGROUND OF THE INVENTION

Power conservation is a major design objective, even in high performance circuits. High speed embedded static random access memories (SRAMs) in current superscalar processors are struggling to keep up with the processors due to rapidly decreasing processor cycle times and to restrictions on power consumption. As processor designs increase in both the degree of scalarity (number of execution units) and word size, embedded cache SRAMs are both limiting processor speed (or decreasing throughput as latency increases) and contributing significantly to such a chip's power consumption.

The limitations associated with SRAMs are primarily due to conventional SRAM design. A SRAM typically comprises an array of cells. The cells in each column of the array are coupled by two lines, known as bit lines, to a sense amplifier, which reads the information stored in the cells by sensing a small differential voltage across the bit-line pair.

Traditional SRAM designs create several power consumption issues. First, wide line sizes comprising the SRAM circuits greatly increase power consumption by requiring many more sense amplifiers, and also take away a design freedom. Second, sense amplifiers dissipate a significant amount of power because the transistors used in differential amplifiers must be placed into a linear operating mode until the voltage difference across the bit-line pair exceeds a predetermined threshold. In addition, due to architectural restrictions, sense amplifiers are becoming more difficult to design; and the traditional method of increasing speed in a SRAM is to increase the power supplied to the sense amplifier.

Accordingly, what is needed is a system and method for providing a RAM structure that uses a sense approach that both increases performance and decreases power consumption. The present invention addresses such a need.

SUMMARY OF THE INVENTION

The present invention is a system and method for minimizing recharge overhead for a domino SRAM circuit, the domino SRAM circuit including a first and second level of logic. The system and method comprises a first recharge line for providing a first recharge signal to the first level of logic, a second recharge line for providing a second recharge signal to the second level of logic, and means for delaying the second recharge signal until the first recharge signal is deactivated, thereby reducing recharge power required to recharge the domino SRAM circuit.

According to the system and method disclosed herein, recharge cycle times for the domino SRAM circuit is reduced. Furthermore, evaluation time of the domino SRAM circuit is improved by forty percent.

DESCRIPTION OF THE INVENTION

The present invention relates to an improvement in recharging domino SRAM circuits. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Other types of circuits exist besides those traditionally used to make memory circuits. For example, one type of circuits used to make logic circuits, such as those comprising processor logic, are referred to as dynamic circuits. To clarify that dynamic circuits are different from dynamic type memories, dynamic circuits are referred to here as domino circuits. Domino circuits typically include dynamic nodes that are coupled to a logic tree. During a precharge cycle, the dynamic node is precharged with a voltage, and during an evaluation cycle, the logic tree discharges the dynamic node for evaluation. While domino circuits have long been used to increase performance of logic circuits, they have not traditionally been applied to memory circuits.

Figure 1:
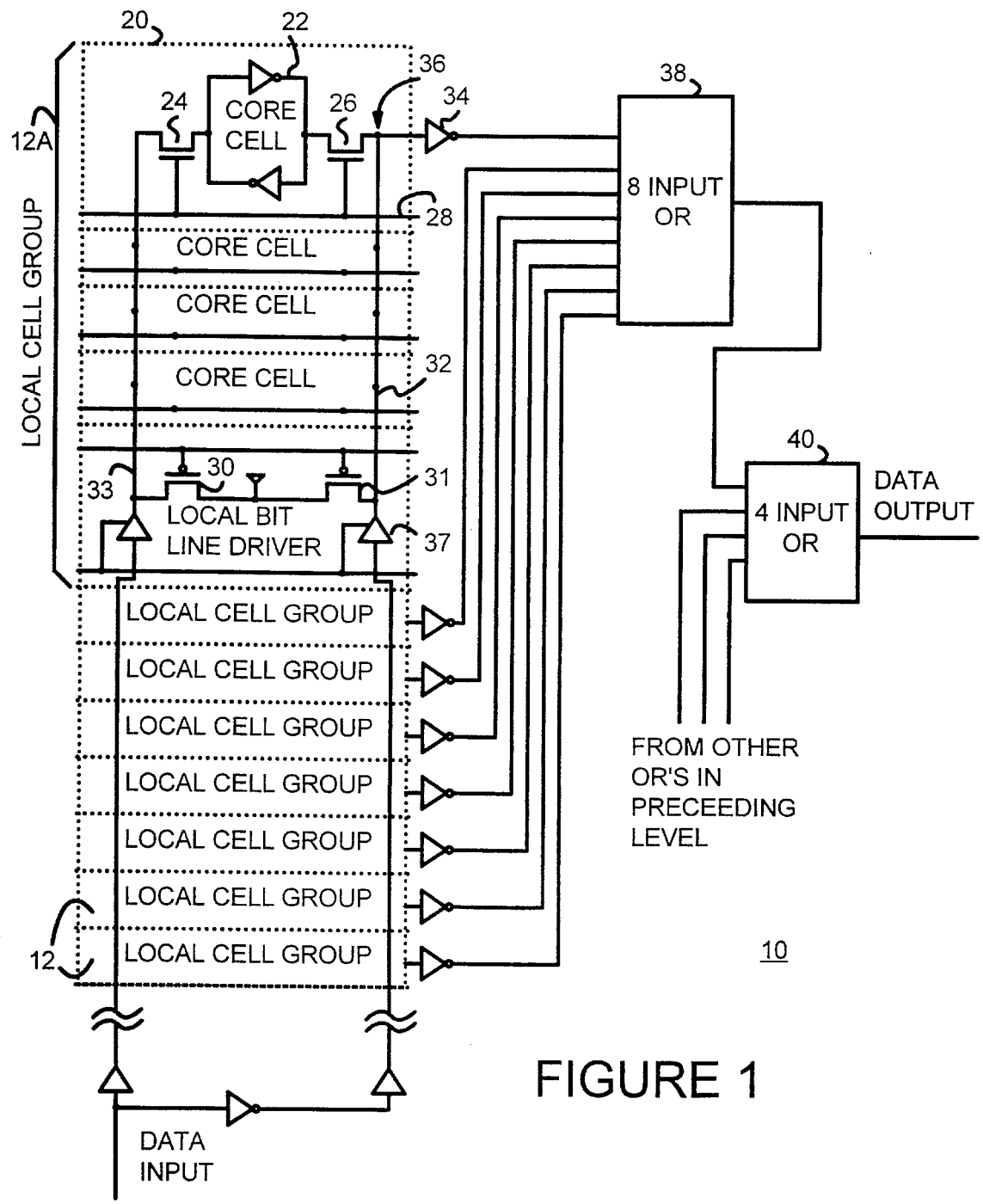
FIG. 1 is a block diagram of a one column array in a SRAM.

Copending application Ser. No. 08/525,939, entitled "High Speed SRAM With OR-Gate Sense" which is herein incorporated by reference, discloses a system and method for combining an SRAM with a domino circuit to provide a domino SRAM that has an OR-gate sense function. Referring to FIG. 1, a high speed domino SRAM 10 is shown, which is divided into local cell groups 12. In a preferred embodiment of the invention, each of the local cell groups 12, shown in expanded cell group 12A, includes four core cells 20. The SRAM 10 replaces conventional sense amplifiers used in SRAMs by partitioning conventional global bit lines into a local bit line 32 and a local bit line 33 for each of the local cell groups 12. A precharge device 30 is coupled to each one of the local bit lines 33, and precharge device 31 and a ratioed inverter 34 are coupled each one of the local bit lines 32. The combination of the local bit line 32, the precharge device 31, and the ratioed inverter 34 transforms a conventional global bit line into a dynamic node 36 of a domino circuit, and provides the sense function for the cell group 12A. Each of the inverters 34 corresponding to a local cell group 12 are input to an Or-gate tree hierarchy comprising an eight-way input-Or 38 a four-way input-Or 40 in order to produce output data.

As disclosed in co-pending application Ser. No. 08.525,939, dynamic logic circuits, such as the domino circuit used in SRAM 10, offer improved performance in many instances over static type structures. However, following an evaluation cycle in which the core cells 20 are read, a recharge cycle is necessary to recharge or precharge the dynamic logic, which increases the SRAM's power consumption.

One reason why conventional recharge methods for dynamic logic circuits consume more power than is necessary is because the recharge signals must travel through the logic tree of the dynamic circuit from one level to the next level. The time required for the recharge cycle is dependent on how many levels of logic the recharge signal must ripple through. The power required for the recharge is greatly influenced by both the number and size of the device the recharge signal must drive and any overlap currents generated while the recharge signal is rippling through the various levels of logic. Conventional dynamic recharge techniques add an additional transistor every Nth logic level's evaluation tree to limit the recharge time and to prevent overlap currents generated in the intervening levels as the recharge signal ripples through those levels.

The present invention takes advantage of the regular structure inherent in RAM arrays to minimize both the effective recharge cycle time and the recharge power required to recharge domino SRAM circuits. This is accomplished by delaying the recharge signals sent to each level of logic until the recharge of the previous level is complete.

Figure 2:
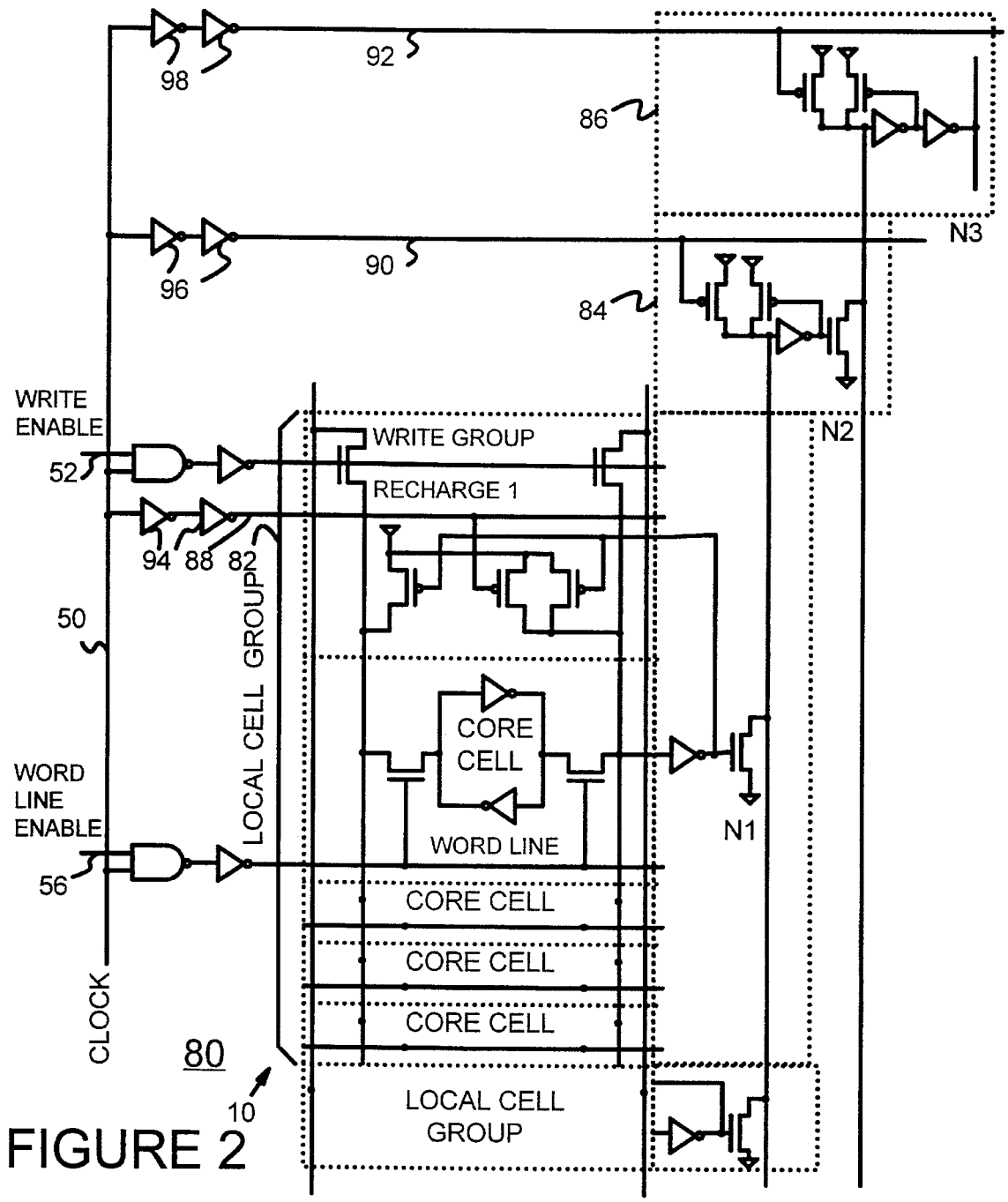
FIG. 2 is a block diagram of a minimal recharge overhead circuit for recharging domino SRAM circuits in accordance with the present invention.

Referring now to FIG. 2, a block diagram of a minimal recharge overhead circuit 80 for recharging domino SRAM circuits is shown. For illustrative purposes, the minimal recharge overhead circuit 80 is shown applied to the domino SRAM 10 that uses Or-gate sense to generate data outputs. But as will be apparent to those skilled in the art, the minimal recharge overhead circuit 80 may be applied to any dynamic logic circuit.

Three local cell groups 82, 84, and 86 of the domino SRAM 10 are shown in FIG. 2. A write enable signal 52 and a word line enable 56 are coupled to a clock signal 50 for each of the local cell groups 82, 84, and 86, respectively. Each of the local cell groups 82, 84, and 86 also include an inverter coupled to an evaluation transistor, shown as N1, N2, and N3, respectively. Local cell group 82 is the first level of the domino circuit. N1 is the dynamic node of local cell group 84, which forms the second level of the domino circuit; and N2 is the dynamic node of local cell group 86, which forms the third level of the domino circuit. The dynamic nodes N1, N2 and N3 are recharged by recharge lines 88, 90, and 92, respectively.

When a cell from local cell group 82 is evaluated, N1 activates causing N2 to activate, causing N3 to activate. After an evaluation cycle, N1, N2, and N3 remain active and must be recharged along with rest of the domino tree. In traditional designs, N1 begins recharging as soon as recharge line 88 is activated. However, N2 cannot begin to recharge until N1 completes recharging, because N1 remains active during this time, preventing the recharge of N2. Likewise, N3 cannot begin to recharge until N2 completes recharging, and so on for each level in the array. After the recharging of N1 is complete, N1 is deactivated and the recharge of N2 proceeds. This process waste power because recharge lines 90 and 92 are active while N1 is recharging, which conducts power from Vdd to ground.

According to the present invention, activation of the recharge lines are successively delayed in common across the Or-tree for the entire SRAM 10. All recharge lines for the second level of the domino circuit are delayed until completion of the first level recharge, and of all recharge lines for the third level of the domino circuit are delayed until completions of the second level recharge, and so on.

The recharge delays are accomplished by first using a commercially available circuit simulator to measure the recharge completion time of each level of the tree. Inputs to this procedure include the clock signal 50, which is used as a timing reference, the recharge lines 88, 90, and 92, and the corresponding write enable signal 52 and the word line enable 56.

After the recharge completion time of each level of the tree is determined, buffers 94, 96, and 98, are added to the recharge lines 88, 90, and 92. The size and number of the buffers are adjusted to add a predetermined delay to the recharge signals. In a preferred embodiment of the present invention, the buffers 94, 96, and 98 comprise inverters, but other types of buffers may also be used. Also, since the metal wires comprising clock signal 50, the write enable signal 52, the word line enable 56, and the recharge lines 88, 90, and 92, all include resistance and capacitance wiring delays, the length and width of the metal wires may be adjusted to introduce further signal delays.

The adjustments to the buffers 94, 96, and 98, and to the metal wires are made so that on the first level of the domino circuit, the recharge line 88 is not activated until the write enable signal 52 and the word line enable 56 are deactivated. The recharge line 90 for the second level is not activated until N1 is deactivated, which indicates that the recharge for the first level is complete. The recharge line 92 for the third is not activated until N2 is deactivated, which indicates that the recharge for the second level is compete.

Successively delaying recharge signals in the array, eliminates the need for devices in series with evaluation transistors to speed the recharge time, to prevent overlap current, and to prevent cell current through the word line transistor. The elimination of the series devices improves the evaluation time of the circuit 80 by forty percent. In addition, part of the reduced recharge cycle time is actually hidden in the following evaluation cycle, due to the staggered delays, without affecting the evaluation time. This aids in improving evaluation times, since longer recharge times may be used which allows for smaller recharge devices and lower load capacitance.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A domino SRAM circuit, comprising:

a first level of logic, the first level of logic including, a plurality of core cells for storing information, a domino circuit coupled to the plurality of core cells for sensing information stored in the plurality of core cells, and a word line coupled to the plurality of core cells for activating the domino circuit;

a first recharge line for providing a first recharge signal to the first level of logic;

means coupled to the first recharge line for delaying the first recharge signal to the first level of logic until the word line is deactivated;

a second level of logic coupled to the first level of logic;

a second recharge line for providing a second recharge signal to the second level of logic; and means coupled to the second recharge line for delaying the second recharge signal to the second level of logic until the first recharge signal is deactivated.

2. A circuit as in claim 1 wherein the means for delaying the second recharge signal includes a first buffer coupled to the second recharge line.

3. A circuit as in claim 1 wherein the means for delaying the second recharge signal includes a first resistance and capacitance wiring delay on the second recharge line.

4. A circuit as in claim 3 wherein the means for delaying the first recharge signal includes a second buffer coupled to the first recharge line.

5. A circuit as in claim 3 wherein the means for delaying the first recharge signal includes a second resistance and capacitance wiring delay on the first recharge line.

6. A method of minimizing recharge overhead for a domino SRAM circuit, the domino SRAM circuit including a first and second level logic, the first level of logic including a plurality of core cells having a domino circuit for sensing information stored in the plurality of core cells, the method comprising the steps of:

providing a first recharge signal to the first level of logic for recharging the domino circuit;

providing a second recharge signal to the second level of logic for recharging the second level of logic;

providing an active word line enable signal to the first level of logic for activating the domino circuit;

delaying activation of the first recharge signal until the word line enable signal is deactivated; and delaying activation of the second recharge signal until the recharge of the domino circuit is complete.

* * * * *